(12) United States Patent
Tachikawa

(10) Patent No.: US 9,585,238 B2
(45) Date of Patent: Feb. 28, 2017

(54) PRINTED CIRCUIT BOARD

(71) Applicant: FUJIKURA LTD., Tokyo (JP)

(72) Inventor: Yasuyuki Tachikawa, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 14/439,322

(22) PCT Filed: Oct. 28, 2013

(86) PCT No.: PCT/JP2013/079089
§ 371 (c)(1),
(2) Date: Apr. 29, 2015

(87) PCT Pub. No.: WO2014/069389
PCT Pub. Date: May 8, 2014

(65) Prior Publication Data
US 2015/0305136 A1  Oct. 22, 2015

(30) Foreign Application Priority Data

Oct. 30, 2012 (JP) .................................. 2012-238496
Oct. 30, 2012 (JP) .................................. 2012-238501

(51) Int. Cl.
*H05K 1/02* (2006.01)
*H05K 3/28* (2006.01)

(52) U.S. Cl.
CPC ............. *H05K 1/02* (2013.01); *H05K 1/0281* (2013.01); *B32B 2307/202* (2013.01);
(Continued)

(58) Field of Classification Search
CPC ..................................................... H05K 1/02
(Continued)

(56) References Cited

U.S. PATENT DOCUMENTS

2001/0018986 A1* 9/2001 Nagai ................. C08L 79/08
174/259
2003/0007332 A1* 1/2003 Seki ................... H05K 3/381
361/750
(Continued)

FOREIGN PATENT DOCUMENTS

JP     08-293213 A   * 11/1996
JP     8-293213 A     11/1996
(Continued)

OTHER PUBLICATIONS

Communication dated Jan. 11, 2016 from the Taiwanese Intellectual Property Office in counterpart application No. 102139264.
(Continued)

*Primary Examiner* — Timothy Thompson
*Assistant Examiner* — Charles Pizzuto
(74) *Attorney, Agent, or Firm* — Sughrue Mion, PLLC

(57) ABSTRACT

Provided is a printed circuit board which is used in a bent state, including: a substrate; a first conductive layer which is formed on the substrate; a first insulation layer which is formed on the substrate so as to cover the first conductive layer; and a second conductive layer which is formed on the first insulation layer, wherein on the assumption that the Youngs modulus of the first insulation layer is indicated by Ei1 and the fracture elongation of the second conductive layer is indicated by Bc2, the following equations (I) and (II) are satisfied.

$$10 \text{ MPa} \leq Ei1 < 500 \text{ MPa} \tag{I}$$

$$Bc2 \geq 10\% \tag{II}$$

11 Claims, 10 Drawing Sheets

(52) U.S. Cl.
CPC ... *B32B 2307/206* (2013.01); *B32B 2457/208* (2013.01); *H05K 3/28* (2013.01); *H05K 2201/055* (2013.01)

(58) Field of Classification Search
USPC ........................................................ 174/254
See application file for complete search history.

(56) References Cited

U.S. PATENT DOCUMENTS

2010/0147566 A1   6/2010  Sato
2011/0247863 A1  10/2011  Watanabe

FOREIGN PATENT DOCUMENTS

| JP | 2006-339186 | A | * | 12/2006 |
| JP | 2007-96131 | A | | 4/2007 |
| JP | 2011-178106 | A | | 9/2011 |
| JP | 2011-222664 | A | | 11/2011 |
| JP | 2012-67221 | A | | 4/2012 |
| TW | 465264 | | * | 11/2001 |
| TW | 200711543 | A | | 3/2007 |
| TW | I289584 | | * | 11/2007 |
| TW | 200826246 | A | | 6/2008 |
| WO | 2008/146538 | A1 | | 12/2008 |

OTHER PUBLICATIONS

Communication dated Mar. 8, 2016 from the Japanese Patent Office in counterpart application No. 2012-238496.
International Search Report for PCT/JP2013/079089 dated Nov. 26, 2013.

* cited by examiner

PRINTED CIRCUIT BOARD

CROSS REFERENCE TO RELATED APPLICATIONS

This application is a National Stage of International Application No. PCT/JP2013/079089 filed Oct. 28, 2013, claiming priority based on Japanese Patent Application Nos. 2012-238496 filed Oct. 30, 2012 and 2012-238501 filed Oct. 30, 2012, the contents of all of which are incorporated herein by reference in their entirety.

TECHNICAL FIELD

The present invention relates to a printed circuit board.

BACKGROUND ART

There is known a printed circuit board which is used while being bent at predetermined curvature radius (for example, see Patent Document 1).

CITATION LIST

Patent Document

Patent Document 1: JP 2011-222664 A

DISCLOSURE OF THE INVENTION

Problem to be Solved by the Invention

However, in the above-described related art, the printed circuit board may be bent at a comparatively large curvature radius. But, when the printed circuit board is bent at the curvature radius of approximately zero, that is, the curvature radius of 0.5 mm or less, a problem arises in that a disconnection or a crack occurs in the printed circuit board.

The invention is made to solve the above-described problems, and an object of the invention is to provide a printed circuit board capable of effectively suppressing a disconnection or a crack even when the printed circuit board is bent at the curvature radius of 0.5 mm or less.

Means for Solving Problem

[1] A printed circuit board according to the invention, which is used in a bent state, comprising: a substrate; a first conductive layer which is formed on the substrate; a first insulation layer which is formed on the substrate so as to cover the first conductive layer; and a second conductive layer which is formed on the first insulation layer, wherein on the assumption that the Youngs modulus of the first insulation layer is indicated by $Ei1$ and the fracture elongation of the second conductive layer is indicated by $Bc2$, the following equations (I) and (II) are satisfied.

$$10\ \text{MPa} \leq Ei1 \leq 500\ \text{MPa} \qquad (\text{I})$$

$$Bc2 \geq 10\% \qquad (\text{II})$$

[2] In the above-described invention, the glass-transition temperature of the first insulation layer may be 30° C. or less.

[3] In the above-described invention, the printed circuit board may further include a second insulation layer which is formed on the first insulation layer so as to cover the second conductive layer, wherein the surface roughness Ra of the second insulation layer may fall into the range of 0.1 µm<Ra<10 µm.

[4] In the above-described invention, the printed circuit board may further include a third insulation layer which is different from the first insulation layer and is formed between the first conductive layer and the first insulation layer, wherein on the assumption that the Youngs modulus of the third insulation layer is indicated by $Ei3$, the following equation (III) is satisfied.

$$Ei1 > Ei3 \qquad (\text{III})$$

[5] In the above-described invention, the following equation (IV) may be satisfied.

$$1\ \text{MPa} < Ei3 < 100\ \text{MPa} \qquad (\text{IV})$$

[6] In the above-described invention, the glass-transition temperature of the third insulation layer may be lower than the glass-transition temperature of the second insulation layer.

[7] In the above-described invention, the printed circuit board may further include an additional layer which is formed on the surface of the substrate opposite to the first conductive layer.

Effect of the Invention

According to the invention, since the Youngs modulus $Ei1$ of the first insulation layer and the fracture elongation $Bc2$ of the second conductive layer satisfy the above-described equations (I) and (II), it is possible to effectively suppress a disconnection and a crack even when the printed circuit board is bent at the curvature radius of 0.5 mm or less when the printed circuit board is assembled in an electronic device or the like.

MODE(S) FOR CARRYING OUT THE INVENTION

Hereinafter, embodiments of the present invention will be described with reference to the drawings.

First Embodiment

Figure 1:
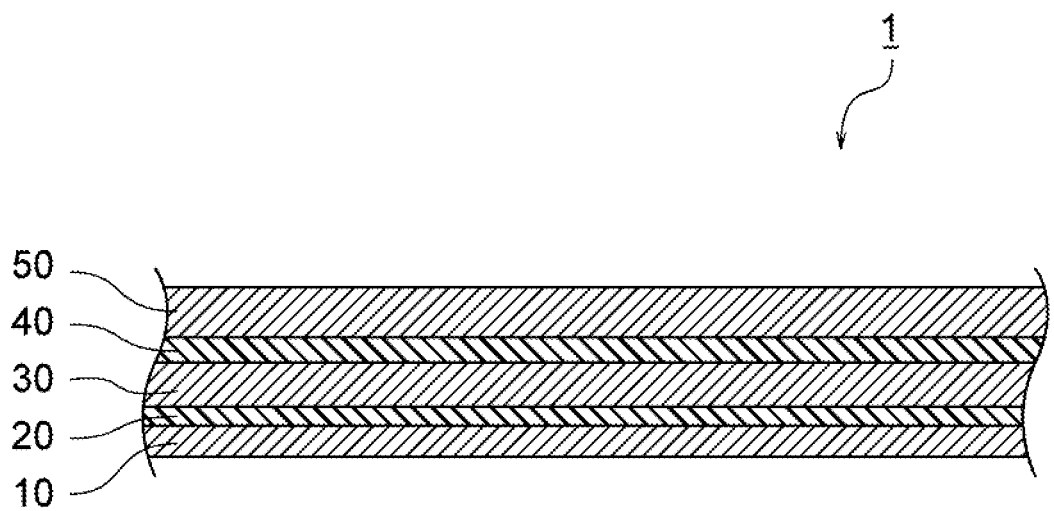
FIG. 1 is a cross-sectional view of a printed circuit board 1 according to a first embodiment.
Figure 2:
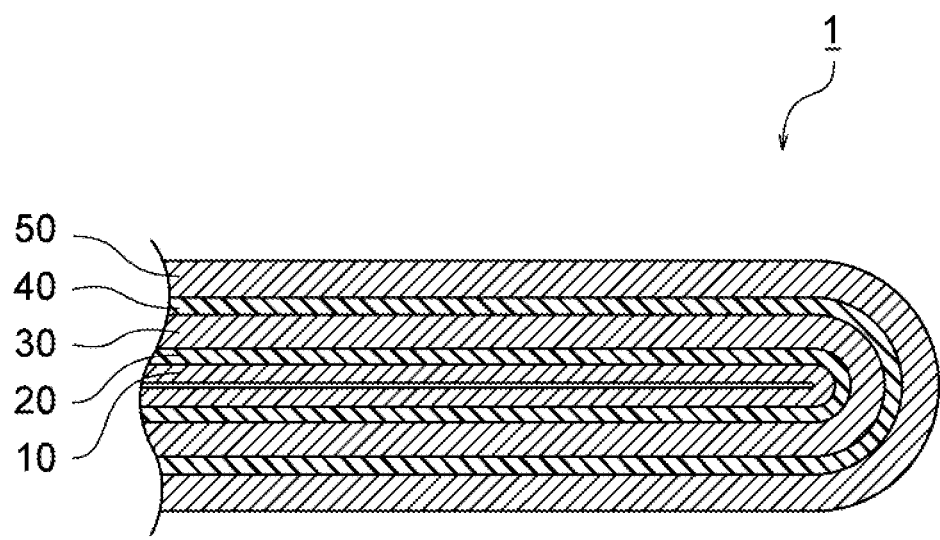
FIG. 2 is a cross-sectional view illustrating a state where the printed circuit board 1 according to the first embodiment is bent.

FIG. 1 is a cross-sectional view of a printed circuit board 1 according to a first embodiment, and FIG. 2 is a cross-sectional view illustrating a state where the printed circuit board 1 according to the first embodiment is bent.

The printed circuit board 1 of the embodiment is a substrate of a so-called electrostatic capacitance type touch input device, and is used in a bent state when being assembled in an electronic device or the like. As illustrated in FIG. 2, the printed circuit board 1 is used in a state that the curvature radius of the printed circuit board is normally 0.5 mm or less, the curvature radius thereof is particularly 0.3 mm or less, and the curvature radius thereof is substantially zero. Furthermore, the printed circuit board 1 of the present embodiment may be used in various electronic devices. More specifically, the printed circuit board is appropriately used as a substrate of a touch pad of a laptop personal computer.

As illustrated in FIG. 1, the printed circuit board 1 of the present embodiment includes a substrate 10, a first conductive layer 20, a first insulation layer 30, a second conductive layer 40, and a second insulation layer 50.

<Substrate 10>

As the substrate 10, it may be formed of a flexible material so that the printed circuit board 1 is bendable at the curvature radius of 0.5 mm or less as illustrated in FIG. 2. Although the material is not particularly limited, it is preferable to use polyethylene terephthalate (PET) or polyethylene naphthalate (PEN), from the viewpoint that these have excellent flexibility and low cost so that product cost can be decreased.

<First Conductive Layer 20>

The first conductive layer 20 is a layer having conductivity which is formed on the substrate 10 in a predetermined pattern. In general, the first conductive layer 20 is formed by screen-printing a conductor paste including a conductor particle and a binder resin and curing the same.

As the conductor particle included in the conductor paste, various kinds of metal such as silver or various kinds of conductive materials such as carbon may be used. However, it is preferable to use a conductor particle having an average particle diameter D50 falling into the range of 1 µm<D50<10 µm. By using the conductor particle the conductor particle having an average particle diameter D50 within the above-described range, even when a microscopic crack is occurred in a bending portion of the first conductive layer 20 when the first conductive layer 20 is pulled in the state where the printed circuit board 1 is bent at the curvature radius of 0.5 mm or less, the propagation of the microscopic crack within the first conductive layer 20 may be prevented. Accordingly, an effect of suppressing the disconnection of the first conductive layer 20 may be further improved.

Further, as the binder resin included in the conductor paste, a thermosetting resin which is cured by heat is preferable. For example, a polyester resin, an epoxy resin, and a polyurethane resin may be exemplified, and among these, the polyester resin is particularly preferable.

In the present embodiment, as the first conductive layer 20, one in which the Youngs modulus $Ec1$ [MPa] satisfies the following equation (1) is preferable, or one in which the fracture elongation $Bc1$ [%] satisfies the following equation (2) is preferable.

$$100 \text{ MPa} < Ec1 < 1000 \text{ MPa} \qquad (1)$$

$$Bc1 \geq 10\% \qquad (2)$$

Furthermore, the Youngs modulus $Ec1$ and the fracture elongation $Bc1$ of the first conductive layer 20 may be measured by conducting a tensile test based on JIS K7127, for example, using a film-shaped article that is manufactured, by using the conductor paste for forming the first conductive layer 20, in a condition similar to a condition in which the first conductive layer 20 is formed.

Further, in the present embodiment, the Youngs modulus $Ec1$ and the fracture elongation $Bc1$ of the first conductive layer 20 may be controlled by adjusting, for example, the content of the binder resin included in the first conductive layer 20 or the type of the binder resin included in the first conductive layer 20.

Specifically, there is a tendency that the Youngs modulus $Ec1$ decreases and the fracture elongation $Bc1$ increases when the content of the binder resin in the first conductive layer 20 is increased. Meanwhile, there is a tendency that the Youngs modulus $Ec1$ increases and the fracture elongation $Bc1$ decreases when the content of the binder resin is decreased. Further, there is a tendency that the Youngs modulus $Ec1$ decreases and the fracture elongation $Bc1$ increases as the glass-transition temperature (Tg) of the binder resin decreases. Meanwhile, there is a tendency that the Youngs modulus $Ec1$ increases and the fracture elongation $Bc1$ decreases as the glass-transition temperature (Tg) of the binder resin increases. Similarly, there is a tendency that the Youngs modulus $Ec1$ decreases and the fracture elongation $Bc1$ increases as the content of the soft segment in the binder resin increases. Further, there is a tendency that the Youngs modulus $Ec1$ decreases and the fracture elongation $Bc1$ increases as the content of a plasticizer increases. For that reason, in the present embodiment, the Youngs modulus $Ec1$ and the fracture elongation $Bc1$ of the first conductive layer 20 may be controlled by appropriately adjusting such conditions.

<First Insulation Layer 30>

The first insulation layer 30 is a layer having insulation properties which is formed on the substrate 10 so as to cover the first conductive layer 20 formed in a pattern shape. The first insulation layer 30 is formed by a method of laminating an insulation resin film or a method of screen-printing an insulation paste including an insulation resin and curing the same. The insulation resin is not particularly limited, but a photocurable resin which is cured by UV rays or electron rays is preferable. For example, a UV curable polyurethane acrylate-based resin may be exemplified. Further, the first insulation layer 30 may include inorganic filler such as silica, mica, clay, talc, titanium oxide, calcium carbonate, aluminum hydroxide, and magnesium hydroxide if necessary.

Furthermore, in the present embodiment, when a method of screen-printing an insulation paste is employed in order to form the first insulation layer 30, it is preferable to perform the steps of printing and curing an insulation paste in two times from the view point that the generation of pinholes is effectively suppressed. That is, it is preferable to form the first insulation layer 30 by applying an insulation paste onto the substrate 10 having the first conductive layer 20 formed thereon through screen-printing, and light curing the insulation paste, then applying an insulation paste thereonto through screen-printing, and light curing the insulation paste. Furthermore, when the first insulation layer 30 is formed by two steps of printing and curing the insulation paste in this way, the insulation pastes substantially having the same composition may be used. In this case, the layers which are formed by two steps have substantially the same composition and have substantially the same characteristics (for example, the characteristics involved with the Youngs modulus, the fracture elongation, and the glass-transition temperature). For this reason, the layers may be substantially regarded as one layer.

In the present embodiment, the first insulation layer 30 is formed so that the Youngs modulus Ei1 [MPa] satisfies the following equation (3).

$$10 \text{ MPa} < Ei1 < 500 \text{ MPa} \quad (3)$$

That is, in the present embodiment, the first insulation layer 30 is formed so that the Youngs modulus Ei1 is larger than 10 MPa and smaller than 500 MPa. According to the present embodiment, since the Youngs modulus Ei1 of the first insulation layer 30 is larger than 10 MPa and smaller than 500 MPa and the fracture elongation Bc2[%] of the second conductive layer 40 is equal to or larger than 10% as will be described later, it is possible to effectively prevent the disconnection of the conductive layers 20 and 40 or the crack of the insulation layers 30 and 50 even when the printed circuit board 1 of the present embodiment is bent so that the curvature radius becomes 0.5 mm or less, the curvature radius becomes preferably 0.3 mm or less, and the curvature radius becomes more preferably substantially zero as illustrated in FIG. 2. Furthermore, it is preferable that the Youngs modulus Ei1 of the first insulation layer 30 fall into the range of 50 MPa<Ei1<200 MPa.

Further, in the present embodiment, the first insulation layer 30 may be formed so that the Youngs modulus Ei1 satisfies the above-described equation (3). However, it is preferable that the fracture elongation Bi1 [%] satisfy the following equation (4) in addition to the Youngs modulus Ei1 satisfying the above-described equation (3).

$$Bi1 > 100\% \quad (4)$$

Furthermore, in the present embodiment, the Youngs modulus Ei1 and the fracture elongation Bi1 of the first insulation layer 30 may be measured by conducting a tensile test based on JIS K7127, for example, using a film-shaped article that is manufactured, by using the insulation paste for forming the first insulation layer 30, in a condition similar to a condition in which the first insulation layer 30 is formed.

Further, in the present embodiment, the Youngs modulus Ei1 and the fracture elongation Bi1 of the first insulation layer 30 may be controlled by adjusting, for example, the content of the insulation resin included in the first insulation layer 30 or the type of the insulation resin included in the first insulation layer 30.

Specifically, there is a tendency that the Youngs modulus Ei1 decreases and the fracture elongation Bi1 increases when the content of the insulation resin in the first insulation layer 30 is increased. Meanwhile, there is a tendency that the Youngs modulus Ei1 increases and the fracture elongation Bi1 decreases when the content of the insulation resin is decreased. Further, there is a tendency that the Youngs modulus Ei1 decreases and the fracture elongation Bi1 increases as the glass-transition temperature (Tg) of the insulation resin decreases. Meanwhile, there is a tendency that the Youngs modulus Ei1 increases and the fracture elongation Bi1 decreases as the glass-transition temperature (Tg) of the insulation resin increases. Similarly, there is a tendency that the Youngs modulus Ei1 decreases and the fracture elongation Bi1 increases as the content of the soft segment in the insulation resin increases. Further, there is a tendency that the Youngs modulus Ei1 decreases and the fracture elongation Bi1 increases as the ratio of the resin with respect to the filler increases. For that reason, in the present embodiment, the Youngs modulus Ei1 and the fracture elongation Bi1 of the first insulation layer 30 may be controlled by appropriately adjusting such conditions.

Further, the glass-transition temperature (Tg) of the first insulation layer 30 is preferably 30° C. or less from the view point that the first insulation layer 30 exhibits rubber elasticity under a normal temperature and plastic deformation may be effectively suppressed even when the printed circuit board 1 is bent a plurality of times when being assembled in an electronic device.

<Second Conductive Layer 40>

The second conductive layer 40 is a layer having conductivity which is formed on the first insulation layer 30 in a predetermined pattern. The second conductive layer 40 is formed by screen-printing a conductor paste including a conductor particle and a binder resin and curing the same similarly to the first conductive layer 20. As the conductor particle and the binder resin included in the conductor paste, the materials similar to the first conductive layer 20 may be used.

In the present embodiment, the second conductive layer 40 is formed so that the fracture elongation Bc2 [%] satisfies the following equation (5).

$$Bc2 \geq 10\% \quad (5)$$

That is, in the present embodiment, the second conductive layer 40 is formed so that the fracture elongation Bc2 is equal to or larger than 10%. According to the present embodiment, the Youngs modulus Ei1 of the first insulation layer 30 is larger than 10 MPa and smaller than 500 MPa as described above, and the fracture elongation Bc2[%] of the second conductive layer 40 is equal to or larger than 10%. That is, the Youngs modulus Ei1 of the first insulation layer 30 and the fracture elongation Bc2 of the second conductive layer 40 satisfy the above-described equation (3) and the above-described equation (5). Thus, it is possible to effectively prevent the disconnection of the conductive layers 20 and 40 or the crack of the insulation layers 30 and 50 even when the printed circuit board 1 of the present embodiment is bent so that the curvature radius becomes 0.5 mm or less, the curvature radius becomes preferably 0.3 mm or less, and the curvature radius becomes more preferably substantially zero as illustrated in FIG. 2.

In particular, according to the present embodiment, since the Youngs modulus Ei1 of the first insulation layer 30 satisfies the above-described equation (3), the deformation amount of the first insulation layer 30 may be increased relatively when the printed circuit board 1 of the present embodiment is bent so that the curvature radius is 0.5 mm or less. Accordingly, since the first insulation layer 30 is largely deformed, the first insulation layer 30 is thinned at the portion being bent (the bent portion), and hence, due to the amount in which the first insulation layer 30 is thinned, the deformation of the second conductive layer 40 and the second insulation layer 50 located at the outer peripheral side may be suppressed. In addition, in the present embodiment, since the fracture elongation Bc2 of the second conductive layer 40 satisfies the above-described equation (5), the second conductive layer 40 may exhibit a sufficient elongation amount. For that reason, the second conductive layer may appropriately follow the deformation caused by bending in terms of the sufficient elongation amount. Then, according to the present embodiment, since the deformation of the second conductive layer 40 and the second insulation layer 50 may be suppressed and the second conductive layer 40 may appropriately follow the deformation caused by bending in this way, the fracture or the crack of these layers may be effectively prevented even when the printed circuit board 1 of the present embodiment is bent at the curvature radius of 0.5 mm or less.

Further, in the present embodiment, the second conductive layer 40 may be formed so that the fracture elongation Bc2 satisfies the above-described equation (5). However, it is preferable that the Youngs modulus Ec2 [MPa] of the second conductive layer 40 satisfy the following equation (6) in addition to the fracture elongation Bc2 satisfying the above-described equation (5).

$$100 \text{ MPa} < Ec2 < 1000 \text{ MPa} \tag{6}$$

Furthermore, the Youngs modulus Ec2 and the fracture elongation Bc2 of the second conductive layer 40 may be measured similarly to, for example, the Youngs modulus Ec1 and the fracture elongation Bc1 of the first conductive layer 20. Further, the Youngs modulus Ec2 and the fracture elongation Bc2 of the second conductive layer 40 may be controlled by adjusting the content of the binder resin included in the second conductive layer 40 or the type of the binder resin included in the second conductive layer 40 similarly to the Youngs modulus Ec1 and the fracture elongation Bc1 of the first conductive layer 20.

<Second Insulation Layer 50>

The second insulation layer 50 is a layer having insulation properties which is formed on the first insulation layer 30 so as to cover the second conductive layer 40 formed in a pattern shape. The second insulation layer 50 is formed by a method of laminating an insulation resin film or a method of screen-printing an insulation paste including an insulation resin and curing the same similarly to the first insulation layer 30. As the insulation resin, one similar to the first insulation layer 30 may be used. Further, it is preferable that the second insulation layer 50 include inorganic filler. As the inorganic filler, one similar to first insulation layer 30 may be used.

In the present embodiment, as the second insulation layer 50, one in which the Youngs modulus Ei2 [MPa] satisfies the following equation (7) is preferable, or one in which the fracture elongation Bi2 [%] satisfies the following equation (8) is preferable.

$$10 \text{ MPa} < Ei2 < 500 \text{ MPa} \tag{7}$$

$$Bi2 > 100\% \tag{8}$$

Furthermore, the Youngs modulus Ei2 and the fracture elongation Bi2 of the second insulation layer 50 may be measured similarly to, for example, the Youngs modulus Ei1 and the fracture elongation Bi1 of the first insulation layer 30. Further, the Youngs modulus Ei2 and the fracture elongation Bi2 of the second insulation layer 50 may be controlled by adjusting the content of the insulation resin included in the second insulation layer 50 or the type of the insulation resin included in the second insulation layer 50 similarly to the Youngs modulus Ei1 and the fracture elongation Bi1 of the first insulation layer 30.

Further, the glass-transition temperature (Tg) of the second insulation layer 50 is preferably 30° C. or less from the view point that the first insulation layer 30 exhibits rubber elasticity under a normal temperature similarly to the first insulation layer 30.

Furthermore, as the second insulation layer 50, one in which the surface roughness Ra of the surface (the surface opposite to the second conductive layer 40) is controlled in the range of 0.1 μm<Ra<10 μm is preferable by including inorganic filler in the second insulation layer 50. Particularly, when the glass-transition temperature of the second insulation layer 50 is set to 30° C. or less in order to exhibit the rubber elasticity of the second insulation layer 50 under a normal temperature, desired flexibility may be obtained under a normal temperature, but there is a case where stickiness or transfer occurs on the surface. For that reason, in the present embodiment, by adding inorganic filler in order to prevent such a problem, the surface roughness Ra of the second insulation layer 50 is set within the above-described range. As a result, the surface of the second insulation layer 50 is roughened and the stickiness or the blocking of the second insulation layer 50 may be prevented.

Further, in the embodiment, it is preferable that the first insulation layer 30 and the second insulation layer 50 does not have yield point or, even when it has the yield point, has yield elongation of 100% or more, when a tensile test is conducted by using a film-shaped article that is manufactured, by using the insulation paste for forming the first insulation layer 30 and the second insulation layer 50, in a condition similar to a condition in which the first insulation layer 30 and the second insulation layer 50 are formed. Since the first insulation layer 30 and the second insulation layer 50 does not have yield point or, even when it has the yield point, has yield elongation of 100% or more, the plastic deformation of the first insulation layer 30 and the second insulation layer 50 hardly occurs even when the printed circuit board 1 is bent a plurality of times when being assembled in an electronic device. Accordingly, it is possible to effectively prevent a problem in which the resistance value of the second conductive layer 40 located between the first insulation layer 30 and the second insulation layer 50 increases due to the plastic deformation of the first insulation layer 30 and the second insulation layer 50.

According to the present embodiment, as described above, the Youngs modulus Ei1 of the first insulation layer 30 and the fracture elongation Bc2 of the second conductive layer 40 satisfy the above-described equation (3) and the above-described equation (5). Thus, it is possible to effectively prevent the disconnection of the conductive layers 20 and 40 and the crack of the insulation layers 30 and 50 even when the printed circuit board 1 of the present embodiment is bent so that the curvature radius becomes 0.5 mm or less, the curvature radius becomes preferably 0.3 mm or less, and the curvature radius becomes more preferably substantially zero as illustrated in FIG. 2.

In addition, in the present embodiment, it is preferable that the Youngs modulus and the fracture elongation of the first conductive layer 20, the first insulation layer 30, the second conductive layer 40, and the second insulation layer 50 respectively satisfy the above-described equations (1), (2), (4), and (6) to (8) in addition to the Youngs modulus Ei1 of the first insulation layer 30 and the fracture elongation Bc2 of the second conductive layer 40 satisfying the above-described equation (3) and the above-described equation (5). Thus, it is possible to further improve the effect of suppressing the disconnection of the conductive layers 20 and 40 and the crack of the insulation layers 30 and 50 is further improved even when the printed circuit board 1 of the present embodiment is bent so that the curvature radius becomes 0.5 mm or less, the curvature radius becomes preferably 0.3 mm or less, and the curvature radius becomes more preferably substantially zero. Furthermore, in the present embodiment, at least one of the above-described equations (1), (2), (4), and (6) to (8) may be satisfied or any one of the above-described equations (1), (2), (4), and (6) to (8) may be satisfied from the view point that the effect of suppressing the disconnection of the conductive layers and the crack of the insulation layers is further improved.

Second Embodiment

Figure 3:
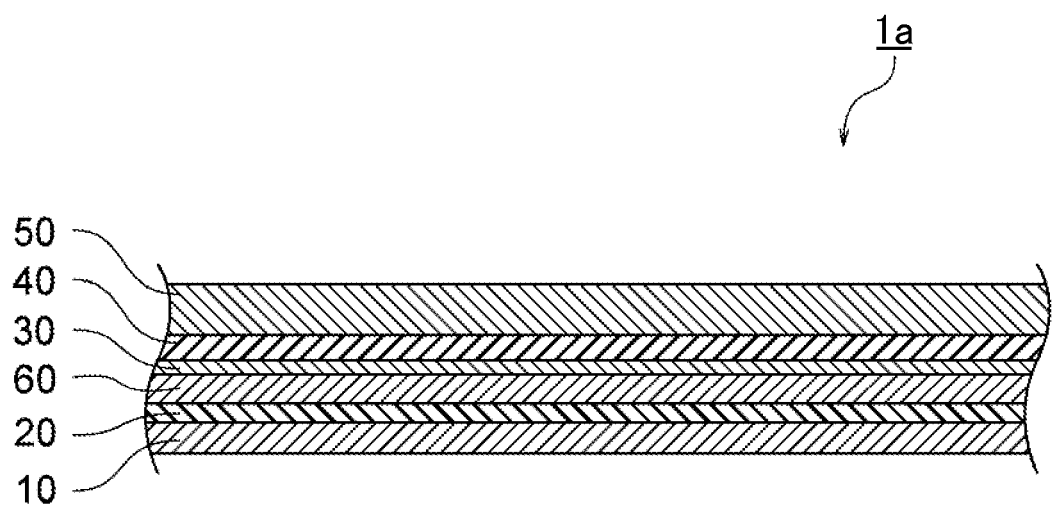
FIG. 3 is a cross-sectional view of a printed circuit board 1a according to a second embodiment.
Figure 4:
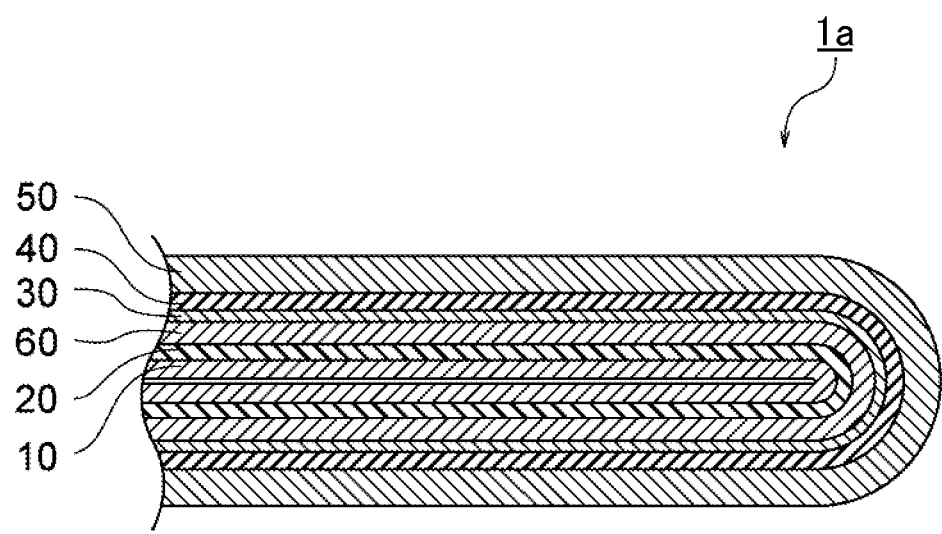
FIG. 4 is a cross-sectional view illustrating a state where the printed circuit board 1a according to the second embodiment is bent.

Next, a second embodiment of the present invention will be described. FIG. 3 is a cross-sectional view a printed circuit board 1a according to the second embodiment, and FIG. 4 is a cross-sectional view illustrating a state where the printed circuit board 1a according to the second embodiment is bent.

The printed circuit board 1a of the second embodiment is a substrate of a so-called electrostatic capacitance type touch input device similarly to the printed circuit board 1 of the first embodiment, and is used in a bent state when the printed circuit board is assembled in an electronic device or the like. As illustrated in FIG. 4, the curvature radius of the printed circuit board is normally 0.5 mm or less, the curvature radius thereof is particularly 0.3 mm or less, and the curvature radius thereof is substantially zero.

As illustrated in FIG. 3, the printed circuit board 1a of the second embodiment includes the substrate 10, the first conductive layer 20, a third insulation layer 60, the first insulation layer 30, the second conductive layer 40, and the second insulation layer 50. That is, the printed circuit board 1a of the second embodiment has the same configuration as the printed circuit board 1 of the first embodiment except that the third insulation layer 60 is provided between the first conductive layer 20 and the first insulation layer 30.

Hereinafter, the printed circuit board 1a of the second embodiment will be described.

<Substrate 10 and First Conductive Layer 20>

The substrate 10 and the first conductive layer 20 may have the same configuration as the printed circuit board 1 of the first embodiment, and may be formed in the same way. That is, the substrate 10 may be formed of a flexible material. Further, the first conductive layer 20 may be formed so that the Youngs modulus Ec1 [MPa] and the fracture elongation Bc1 [%] respectively satisfy the above-described equations (1) and (2).

<Third Insulation Layer 60>

The printed circuit board 1a of the second embodiment includes the third insulation layer 60 which is formed between the first conductive layer 20 and the first insulation layer 30. The third insulation layer 60 is a layer having insulation properties which is formed on the substrate 10 so as to cover the first conductive layer 20 formed in a pattern shape, and the composition thereof is substantially different from that of the first insulation layer 30 to be described later. Accordingly, the third insulation layer 60 substantially has different characteristics from the first insulation layer 30 (for example, the characteristics involved with the Youngs modulus, the fracture elongation, and the glass-transition temperature).

The third insulation layer 60 is formed by a method of laminating an insulation resin film or a method of screen-printing the first insulation layer 30 and curing the same. The insulation resin is not particularly limited, but a photocurable resin which is cured by UV rays or electron rays is preferable. For example, a UV curable polyurethane acrylate resin may be exemplified. Further, the third insulation layer 60 may include inorganic filler such as silica, mica, clay, talc, titanium oxide, calcium carbonate, aluminum hydroxide, and magnesium hydroxide if necessary.

In the second embodiment, the third insulation layer 60 satisfies the following equation (9) by the relation between the Youngs modulus Ei3 [MPa] of the third insulation layer 60 and the Youngs modulus Ei1 [MPa] of the first insulation layer 30.

$$Ei1 > Ei3 \tag{9}$$

According to the second embodiment, the third insulation layer 60 is provided between the first conductive layer 20 and the first insulation layer 30, and the third insulation layer 60 satisfies the above-described equation (9) with respect to the first insulation layer 30. Thus, it is possible to further improve the effect of suppressing the disconnection of the conductive layers 20 and 40 and the crack of the insulation layers 30, 50, and 60 is further improved even when the printed circuit board 1a of the second embodiment is bent so that the curvature radius becomes 0.5 mm or less, the curvature radius becomes preferably 0.3 mm or less, and the curvature radius becomes more preferably substantially zero as illustrated in FIG. 4. Accordingly, it is possible to provide a more reliable printed circuit board.

Here, in the present embodiment, the method in which the Youngs modulus Ei3 of the third insulation layer 60 and the Youngs modulus Ei1 of the first insulation layer 30 satisfy the above-described equation (9) is not particularly limited. For example, a method of forming the third insulation layer 60 by using one which has the glass-transition temperature (Tg) lower than the glass-transition temperature (Tg) of the first insulation layer 30 or a method of adjusting the content of the insulation resin in the third insulation layer 60 to be smaller than the content of the insulation resin in the first insulation layer 30 may be exemplified. However, the method of forming the third insulation layer 60 by using one which has the glass-transition temperature (Tg) lower than the glass-transition temperature (Tg) of the first insulation layer 30 is preferable from the view point that the effect of suppressing the disconnection or the crack of the layers is further improved even when the printed circuit board 1a of the second embodiment is bent at the curvature radius of 0.5 mm or less as illustrated in FIG. 4.

Further, in the second embodiment, as the third insulation layer 60, one in which the Youngs modulus Ei3 [MPa] satisfies the following equation (10) is preferable, or one in which the fracture elongation Bi3 [%] satisfies the following equation (11) is preferable.

$$1 \text{ MPa} < Ei3 < 100 \text{ MPa} \tag{10}$$

$$Bi3 > 100\% \tag{11}$$

Furthermore, the Youngs modulus Ei3 and the fracture elongation Bi3 of the third insulation layer 60 may be measured similarly to, for example, the Youngs modulus Ei1 and the fracture elongation Bi1 of the first insulation layer 30. Further, the Youngs modulus Ei3 and the fracture elongation Bi3 of the third insulation layer 60 may be controlled by adjusting the content of the insulation resin included in the third insulation layer 60 or the type of the insulation resin included in the third insulation layer 60 similarly to the Youngs modulus Ei1 and the fracture elongation Bi1 of the first insulation layer 30.

Further, the glass-transition temperature (Tg) of the third insulation layer 60 is preferably 30° C. or less from the view point that the third insulation layer 60 exhibits rubber elasticity under a normal temperature and plastic deformation may be effectively suppressed even when the printed circuit board 1a is bent a plurality of times when being assembled in an electronic device.

<First Insulation Layer 30>

The first insulation layer 30 is a layer having insulation properties which is formed on the third insulation layer 60, and the composition thereof is substantially different from that of the third insulation layer 60. Accordingly, the first insulation layer substantially has different characteristics from the third insulation layer 60 (for example, the characteristics involved with the Youngs modulus, the fracture elongation, and the glass-transition temperature). The first insulation layer 30 may formed at the same configuration as the printed circuit board 1 of the first embodiment except that the first insulation layer 30 is formed on the third insulation layer 60 and satisfies the above-described equation (9). That is, the first insulation layer 30 may be formed so that the Youngs modulus Ei1 [MPa] satisfies the above-described equation (3) and preferably the fracture elongation Bi1 [%] satisfies the above-described equation (4). Further, it is preferable to form the first insulation layer 30 so that the glass-transition temperature (Tg) is 30° C. or less similarly to the printed circuit board 1 of the first embodiment.

<Second Conductive Layer 40 and Second Insulation Layer 50>

The second conductive layer 40 is a layer having conductivity which is formed on the first insulation layer 30 in a predetermined pattern, and may be formed in the same way by the same configuration as the first embodiment. That is, the second conductive layer 40 may be formed so that the fracture elongation Bc2 [%] satisfies the above-described equation (5) and preferably the Youngs modulus Ec2 [MPa] satisfies the above-described equation (6).

Further, the second insulation layer 50 is a layer having insulation properties which is formed on the first insulation layer 30 so as to cover the second conductive layer 40 formed in a pattern shape, and may be formed in the same by the same configuration as the first embodiment. That is, the second insulation layer 50 may be preferably formed so that the Youngs modulus Ei2 [MPa] and the fracture elongation Bi2 [%] respectively satisfy the above-described equations (7) and (8). Further, in the second embodiment, it is preferable that the second insulation layer 50 satisfy the following equation (12) by the relation between the Youngs modulus Ei2 [MPa] and the Youngs modulus Ei3 [MPa] of the third insulation layer 60.

$$Ei2 > Ei3 \tag{12}$$

Furthermore, the glass-transition temperature (Tg) of the second insulation layer 50 is preferably 30° C. or less and, as the second insulation layer 50, one in which the surface roughness Ra of the surface (the surface opposite to the second conductive layer 40) is controlled in the range of 0.1 μm<Ra<10 μm is preferable by including inorganic filler in the second insulation layer 50 similarly to the printed circuit board 1 of the first embodiment.

According to the second embodiment, as described above, the third insulation layer 60 is provided between the first conductive layer 20 and the first insulation layer 30 and the third insulation layer 60 satisfies the above-described equation (9) with respect to the first insulation layer 30. Thus, it is possible to further improve the effect of suppressing the disconnection of the conductive layers 20 and 40 and the crack of the insulation layers 30, 50, and 60 even when the printed circuit board 1a of the second embodiment is bent so that the curvature radius becomes 0.5 mm or less, the curvature radius becomes preferably 0.3 mm or less, and the curvature radius becomes more preferably substantially zero as illustrated in FIG. 4. Accordingly, it is possible to provide a more reliable printed circuit board.

Furthermore, the above-described embodiments are described to easily comprehend the invention, and are not intended to limit the invention. Thus, the components of the above-described embodiments include all modified components or equivalents thereof within the technical scope of the invention.

Figure 5:
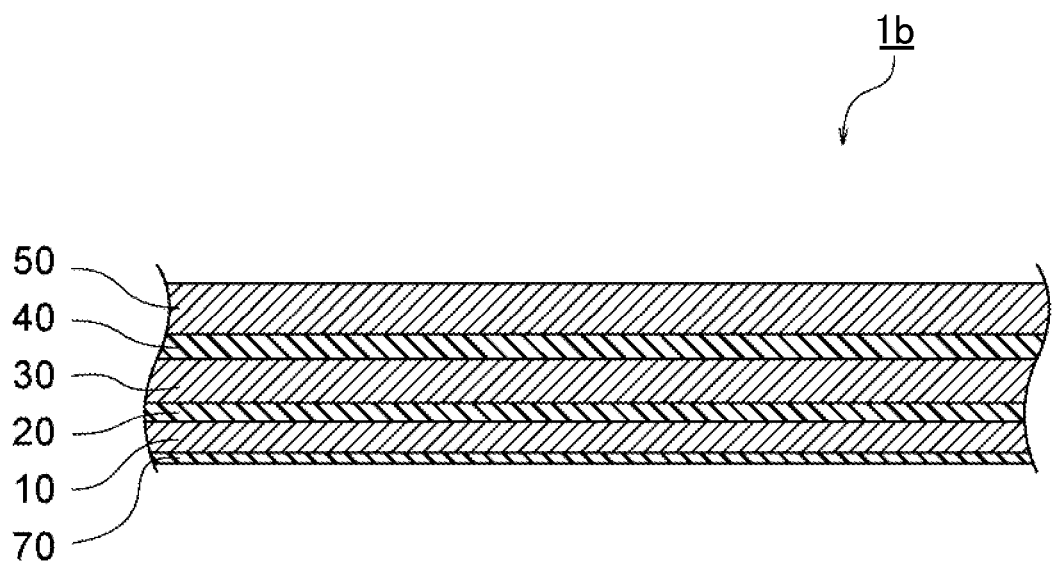
FIG. 5 is a cross-sectional view of a printed circuit board 1b of another embodiment.

For example, as illustrated in FIG. 5, a configuration may be employed in which an additional layer 70 is formed on the surface of the substrate 10 opposite to the first conductive layer 20 in the printed circuit board 1 according to the first embodiment. In this case, even when a printed circuit board 1b which is obtained in this manner is bent in a condition in which the curvature radius is 0.5 mm or less, the curvature radius is particularly 0.3 mm or less, and further the curvature radius is substantially zero, the substantial curvature radius may be increased by the thickness of the additional layer 70 due to the effect of the additional layer 70. Accordingly, it is possible to further improve the effect of suppressing the disconnection of the conductive layers 20 and 40 or the crack of the insulation layers 30 and 50. Furthermore, the additional layer 70 may be any one of the conductive layer and the insulation layer, and may be formed in the same manner as, for example, the conductive layers 20 and 40 or the insulation layers 30 and 50.

Figure 6:
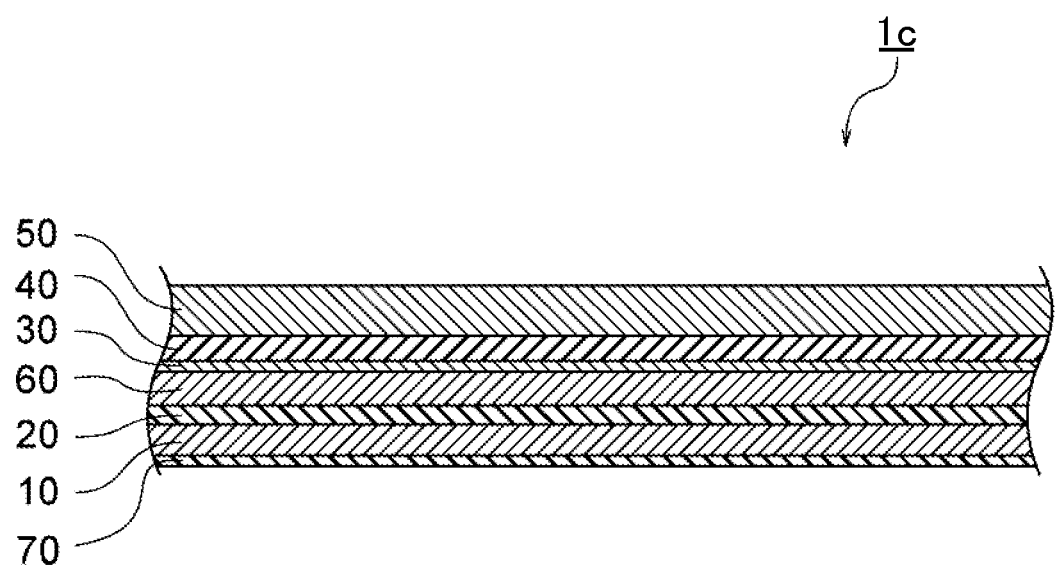
FIG. 6 is a cross-sectional view of a printed circuit board 1c of still another embodiment.

Similarly, as illustrated in FIG. 6, a configuration may be employed in which the additional layer 70 is formed on the surface of the substrate 10 opposite to the first conductive layer 20 in the printed circuit board 1a according to the second embodiment. Even in the printed circuit board 1c obtained in this manner, the same effect as the printed circuit board 1b (see FIG. 5) may be obtained.

EXAMPLES

Hereinafter, the invention will be described in more detail by examples, but the invention is not limited to these examples.

Examples 1 and 2 and Comparative Examples 1 to 3

Manufacturing of Sample of Printed Circuit Board 1

In Examples 1 and 2 and Comparative Examples 1 to 3, a sample of the printed circuit board 1 having a configuration illustrated in FIG. 1 was manufactured by the method described below. That is, a conductor paste was first screen-printed on a PET film having a thickness of 25 μm as the substrate 10 and was cured by heat after a solvent was removed therefrom, so that the first conductive layer 20 having a thickness of 10 μm, a width of 0.4 mm, and a length of 20 mm was formed in a pattern shape. Next, an insulation paste was screen-printed on the substrate 10 having the first conductive layer 20 formed thereon and was irradiated by UV rays (heat cure in Comparative Example 2) after a solvent was removed therefrom, so that an insulation layer having a thickness of 20 μm was formed. Then, an insulation paste was screen-printed thereon and was irradiated by UV rays (heat cure in Comparative Example 2) after a solvent was removed therefrom, so that an insulation layer having a thickness of 20 μm was formed. As a result, the first insulation layer 30 having a thickness of 40 μm in total was formed.

Next, a conductor paste was screen-printed on the first insulation layer 30 and was cured by heat after a solvent was removed therefrom, so that the second conductive layer 40 having a thickness of 10 μm, a width of 0.4 mm, and a length of 20 mm was formed in a pattern shape. Finally, an insulation paste was screen-printed on the first insulation layer 30 having the second conductive layer 40 formed thereon and was irradiated by UV rays (heat cure in Comparative Example 2) after a solvent was removed therefrom, so that the second insulation layer 50 having a thickness of 20 μm was formed. As a result, the sample of the printed circuit board 1 illustrated in FIG. 1 was obtained. In the examples, the heat curing condition for forming the conductive layers was set 150° C. and 30 minutes, and the UV ray irradiation amount for forming the insulation layers was set to 500 mJ/cm².

Examples 3 and 4 and Comparative Examples 4 and 5

Manufacturing of Sample of Printed Circuit Board 1a

In Examples 3 and 4 and Comparative Examples 4 and 5, a sample of the printed circuit board 1a having a configuration illustrated in FIG. 3 was manufactured by the method described below. That is, a conducor paste was screen-printed on a PET film having a thickness of 25 μm as the substrate 10 and was cured by heat after a solvent was removed therefrom, so that the first conductive layer 20 having a thickness of 10 μm, a width of 0.4 mm, and a length of 20 mm was formed in a pattern shape. Next, an insulation paste was screen-printed on the substrate 10 having the first conductive layer 20 formed thereon and was irradiated by UV rays after a solvent was removed therefrom, so that the third insulation layer 60 having a thickness of 20 μm was formed.

Next, an insulation paste was screen-printed on the third insulation layer 60 and was irradiated by UV rays (heat cure in Comparative Example 5) after a solvent was removed therefrom, so that the first insulation layer 30 having a thickness of 20 μm was formed. Then, a conductor paste was screen-printed thereon and was cured by heat after a solvent was removed therefrom, so that the second conductive layer 40 having a thickness of 10 μm, a width of 0.4 mm, and a length of 20 mm was formed in a pattern shape. Finally, an insulation paste was screen-printed on the first insulation layer 30 having the second conductive layer 40 formed thereon and was irradiated by UV rays (heat cure in Comparative Example 3) after a solvent was removed therefrom, so that the second insulation layer 50 having a thickness of 20 μm was formed. As a result, the sample of the printed circuit board 1a illustrated in FIG. 3 was obtained. In the examples, the heat curing condition for forming the conductive layers was set 150° C. and 30 minutes, and the UV ray irradiation amount for forming the insulation layers was set to 500 mJ/cm².

<Bending Test>

The sample of the printed circuit board 1 and the sample of the printed circuit board 1a were cut into the width of 5 mm, and were subjected to a bending test according to the steps (1) to (4) below.

(1) The printed circuit board sample was bent in a condition in which the curvature radius was substantially zero as illustrated in FIG. 2 so that the PET film as the substrate 10 was located at the inside.

(2) A stress of 20 N was applied to the bent printed circuit board sample for 5 seconds, and the resistance values of the first conductive layer 20 and the second conductive layer 40 were measured by a resistance meter.

(3) The bent printed circuit board sample was stretched and a stress of 20 N was applied thereto for 5 seconds.

(4) The steps (1) to (3) were repeated 10 times.

After the bending test ended, the existence of a crack was checked by observing the printed circuit board sample subjected to the bending test using an electronic microscope.

<Insulation Paste Condition>

In Examples and Comparative Examples, the insulation paste below having a composition illustrated in Table 3 was used as the insulation paste for forming the insulation layers 30, 50, and 60. The composition of the insulation paste used herein is illustrated below.

Insulation paste $A_i$: UV curable polyurethane acrylate-based resin (glass-transition temperature: 0° C.) of 70% by weight (in terms of solid content) and talc (particle diameter of 5 to 10 μm) of 30% by weight (in terms of solid content)

Insulation paste $B_i$: UV curable polyurethane acrylate-based resin (glass-transition temperature: 15° C.) of 70% by weight (in terms of solid content) and talc (particle diameter of 5 to 10 μm) of 30% by weight (in terms of solid content)

Insulation paste $C_i$: UV curable polyurethane acrylate-based resin (glass-transition temperature: 35° C.) of 70% by weight (in terms of solid content) and talc (particle diameter of 5 to 10 μm) of 30% by weight (in terms of solid content)

Figure 7:
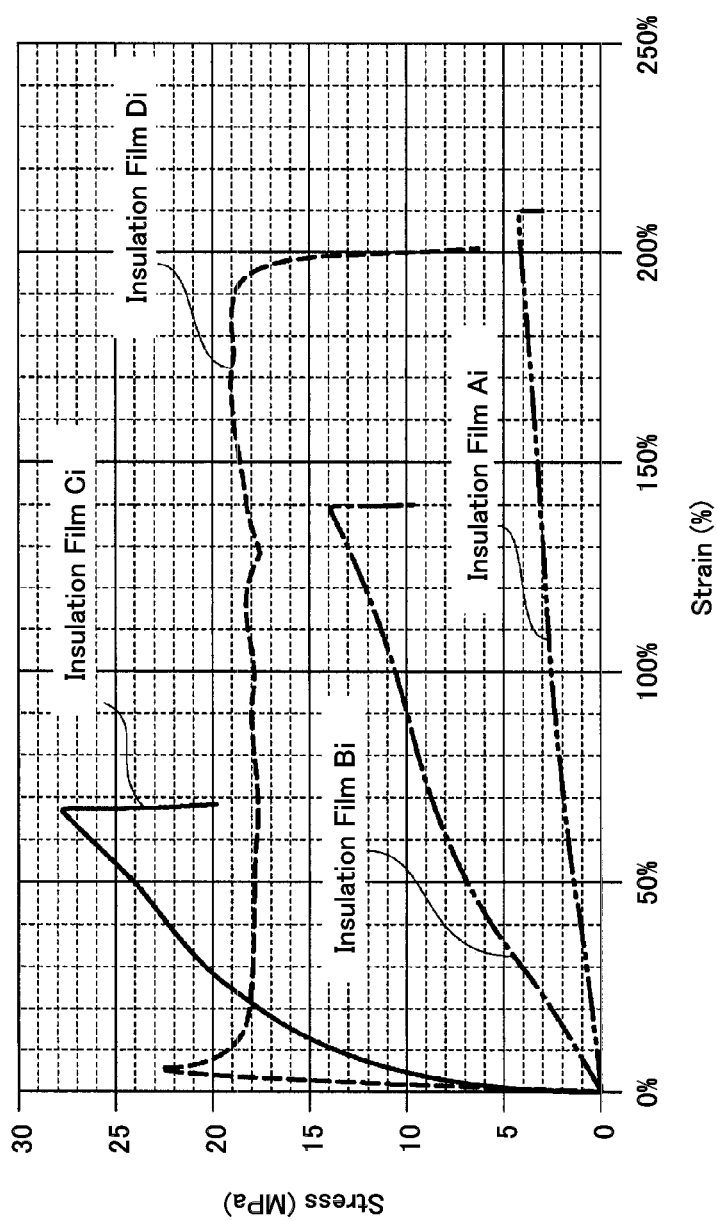
FIG. 7 is a graph illustrating a result of a tensile test for an insulation film which is formed by an insulation paste used in Examples and Comparative Examples.

Insulation paste $D_i$: polyester-based thermosetting resin (glass-transition temperature: 40° C.) of 100% by weight (in terms of solid content) and butyl carbitolacetate as solvent Table 1 illustrates the Youngs modulus, the fracture elongation, and the yield elongation obtained by conducting a tensile test based on JIS K7127 with respect to the insulation films obtained by using the insulation pastes, and FIG. 7 illustrates the measurement result of the tensile test. Note that, insulation pastes $A_i$, $B_i$, and $C_i$ were screen-printed on the substrate with a predetermined thickness and were irradiated by UV rays of 500 mJ/cm² after a solvent was removed therefrom, so that an insulation film was manufactured. Further, an insulation paste $D_i$ was screen-printed on the substrate with a predetermined thickness and was cured by heat at the condition of 150° C. and 30 minutes after a solvent was removed therefrom, so that an insulation film was manufactured. Further, in FIG. 7, the insulation films formed by the insulation pastes $A_i$, $B_i$, $C_i$, and $D_i$ were respectively set as the insulation films $A_i$, $B_i$, $C_i$, and $D_i$.

TABLE 1

| INSULATION FILM | YOUNGS MODULUS [MPa] | FRACTURE ELONGATION [%] | YIELD ELONGATION [%] |
| --- | --- | --- | --- |
| $A_i$ | 10 | 210 | — |
| $B_i$ | 100 | 140 | — |
| $C_i$ | 500 | 68 | — |
| $D_i$ | 800 | 200 | 5 |

<Conductor Paste Condition>

In Examples and Comparative Examples, the conductor paste below having a composition illustrated in Table 3 was used as the conductor paste for forming the conductive layers 20 and 40. The composition of the conductive paste used herein is illustrated below.

Figure 8:
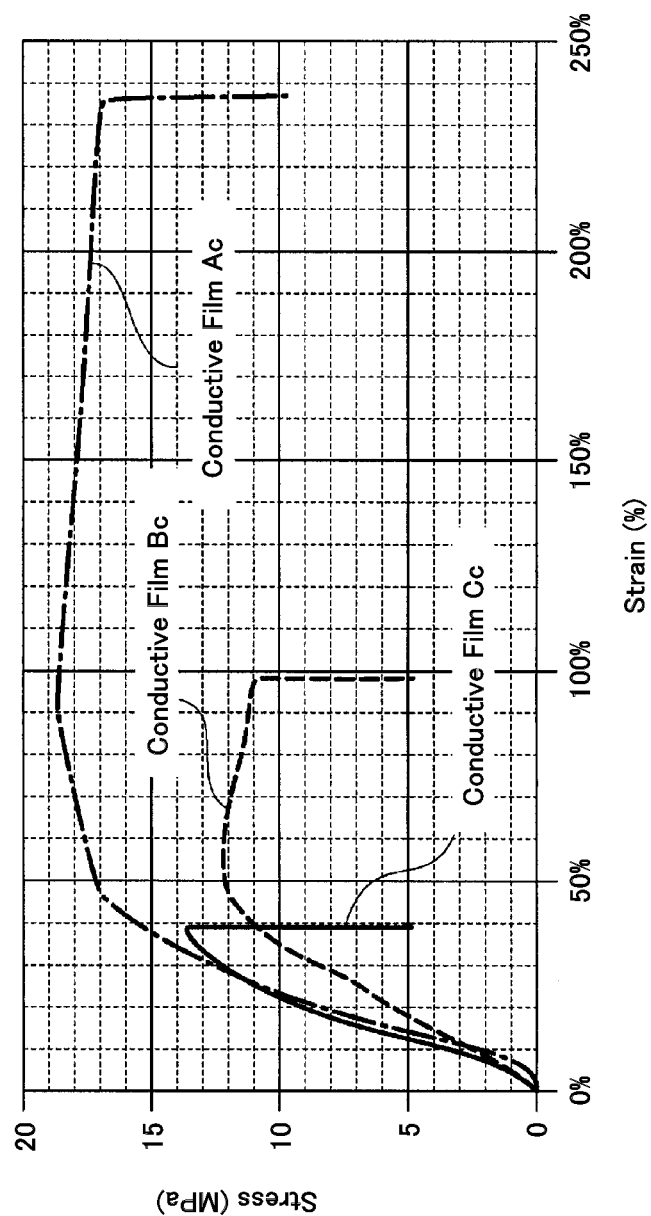
FIG. 8 is a graph illustrating a result of a tensile test for a conductive film which is formed by a conductor paste used in Examples and Comparative Examples.

Conductor paste $A_c$: polyester-based thermosetting resin (glass-transition temperature: 0° C. and filler/resin ratio: 85/15) of 10% by weight (in terms of solid content), particulate silver (particle diameter of 1 to 2 μm) of 90% by weight (in terms of solid content), and butyl carbitolacetate as solvent Conductor paste $B_c$: polyester-based thermosetting resin (glass-transition temperature: 0° C. and filler/resin ratio: 85/15) of 10% by weight (in terms of solid content), scale-like silver particle (particle diameter of 2 to 3 μm) of 90% by weight (in terms of solid content), and butyl carbitolacetate as solvent Conductor paste $C_c$: polyester-based thermosetting resin (glass-transition temperature: 0° C. and filer/resin ratio: 90/10) of 10% by weight (in terms of solid content), scale-like silver particle (particle diameter of 2 to 3 μm) of 90% by weight (in terms of solid content), and butyl carbitolacetate as solvent Table 2 illustrates the Youngs modulus, the fracture elongation, and the yield elongation obtained by conducting a tensile test based on JIS K7127 with respect to the conductor films obtained by using the conductor pastes, and FIG. 8 illustrates the measurement result of the tensile test. Note that, the conductor film was manufactured by screen-printing conductive pastes on the substrate with a predetermined thickness and heat-curing the conductive pastes at the condition of 150° C. and 30 minutes after a solvent was removed therefrom. Further, in FIG. 8, the conductor films formed by using conductor pastes $A_c$, $B_c$, and $C_c$ were respectively set as the conductor films $A_c$, $B_c$, and $C_c$.

TABLE 2

| CONDUCTOR FILM | YOUNGS MODULUS [MPa] | FRACTURE ELONGATION [%] | YIELD ELONGATION [%] |
|---|---|---|---|
| $A_c$ | 500 | 24 | 5 |
| $B_c$ | 300 | 10 | 3 |
| $C_c$ | 500 | 3 | — |

<Test Result>

Table 3 illustrates the combination of the insulation paste and the conductor paste used in Examples and Comparative Examples and also illustrates the test result of the existence of the crack after the bending test and the resistance increase values (resistance increase value=resistance value at tenth bending operation−resistance value before bending test) of the first conductive layer 20 and the second conductive layer 40 at the tenth bending operation during the bending test in Examples and Comparative Examples.

TABLE 3

| | PASTE TYPE IN USE | | | | | EXISTENCE OF CRACK AFTER BENDING TEST | RESISTANCE INCREASE VALUE [Ω] OF FIRST CONDUCTIVE LAYER AFTER TENTH BENDING OPERATION | RESISTANCE INCREASE VALUE [Ω] OF SECOND CONDUCTIVE LAYER AFTER TENTH BENDING OPERATION |
|---|---|---|---|---|---|---|---|---|
| | THIRD INSULATION LAYER | FIRST INSULATION LAYER | SECOND INSULATION LAYER | FIRST CONDUCTIVE LAYER | SECOND CONDUCTIVE LAYER | | | |
| EXAMPLE1 | — | $B_i$ | $B_i$ | $A_c$ | $A_c$ | NO | 3 | 24 |
| EXAMPLE2 | — | $B_i$ | $B_i$ | $B_c$ | $B_c$ | NO | 4 | 31 |
| EXAMPLE3 | $A_i$ | $B_i$ | $B_i$ | $A_c$ | $A_c$ | NO | 3 | 4 |
| EXAMPLE4 | $A_i$ | $B_i$ | $B_i$ | $B_c$ | $B_c$ | NO | 3 | 10 |
| COMPARATIVE EXAMPLE1 | — | $C_i$ | $C_i$ | $A_c$ | $A_c$ | YES | 1000 OR MORE | 1000 OR MORE |
| COMPARATIVE EXAMPLE2 | — | $D_i$ | $D_i$ | $A_c$ | $A_c$ | NO | 6 | 1000 OR MORE |
| COMPARATIVE EXAMPLE3 | — | $B_i$ | $B_i$ | $C_c$ | $C_c$ | NO | 3 | 1000 OR MORE |
| COMPARATIVE EXAMPLE4 | $A_i$ | $C_i$ | $C_i$ | $A_c$ | $A_c$ | NO | 1000 OR MORE | 1000 OR MORE |
| COMPARATIVE EXAMPLE5 | $A_i$ | $D_i$ | $D_i$ | $A_c$ | $A_c$ | NO | 6 | 1000 OR MORE |

From Tables 1 to 3, in Examples 1 to 4 in which the Youngs modulus Ei1 of the first insulation layer 30 and the fracture elongation Bc2 of the second conductive layer 40 satisfied the above-described equation (3) and the above-described equation (5) (that is, the Youngs modulus Ei2 of the first insulation layer 30 was larger than 10 MPa and smaller than 500 MPa and the fracture elongation Bc2 of the second conductive layer 40 was equal to or larger than 10%), any crack was not found after the bending test, and an increase in resistance of each conductive layer was suppressed after the bending test. Accordingly, the result was satisfactory. Particularly, in Examples 3 and 4 in which the third insulation layer 60 was formed between the first conductive layer 20 and the first insulation layer 30 and the Youngs modulus Ei1 of the first insulation layer 30 and the Youngs modulus Ei3 of the third insulation layer 60 satisfied the above-described equation (9) (that is, Ei1>Ei3), an increase in resistance of each conductive layer was particularly suppressed after the bending test.

Meanwhile, in Comparative Examples 1, 2, 4, and 5 in which the Youngs modulus Ei1 of the first insulation layer 30 was equal to or larger than 500 MPa and did not satisfy the above-described equation (3) and in Comparative Example 3 in which the fracture elongation Bc2 of the second conductive layer 40 was smaller than 10% and did not satisfy the above-described equation (5), the resistance of each conductive layer increased after the bending test.

Figure 9:
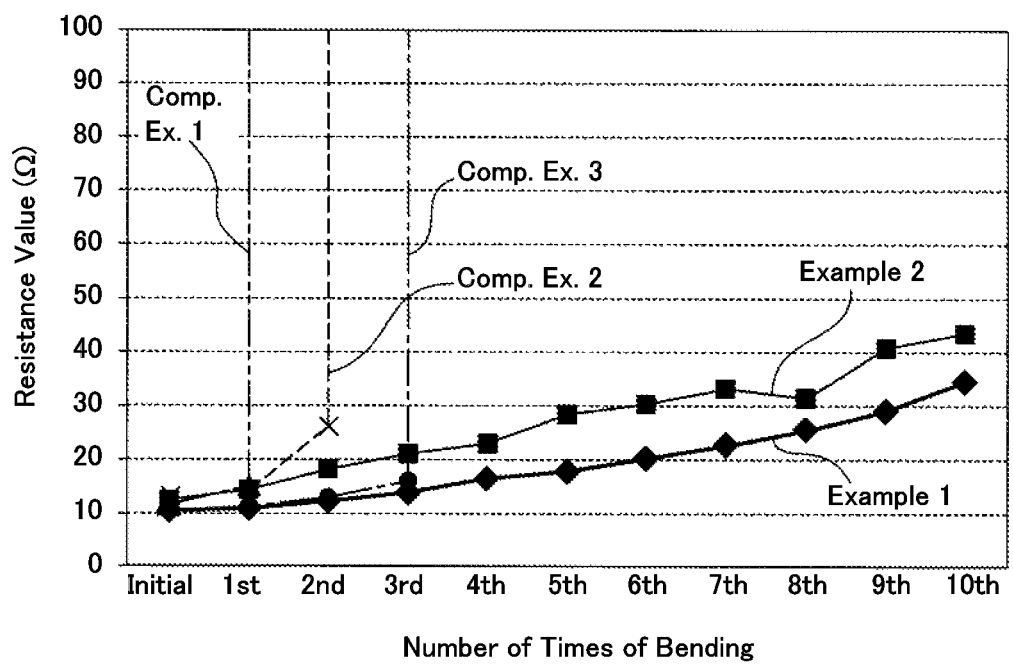
FIG. 9 is a graph illustrating a result of a resistance value of a second conductive layer 40 in Examples 1 and 2 and Comparative Examples 1 to 3 during a bending test.
Figure 10:
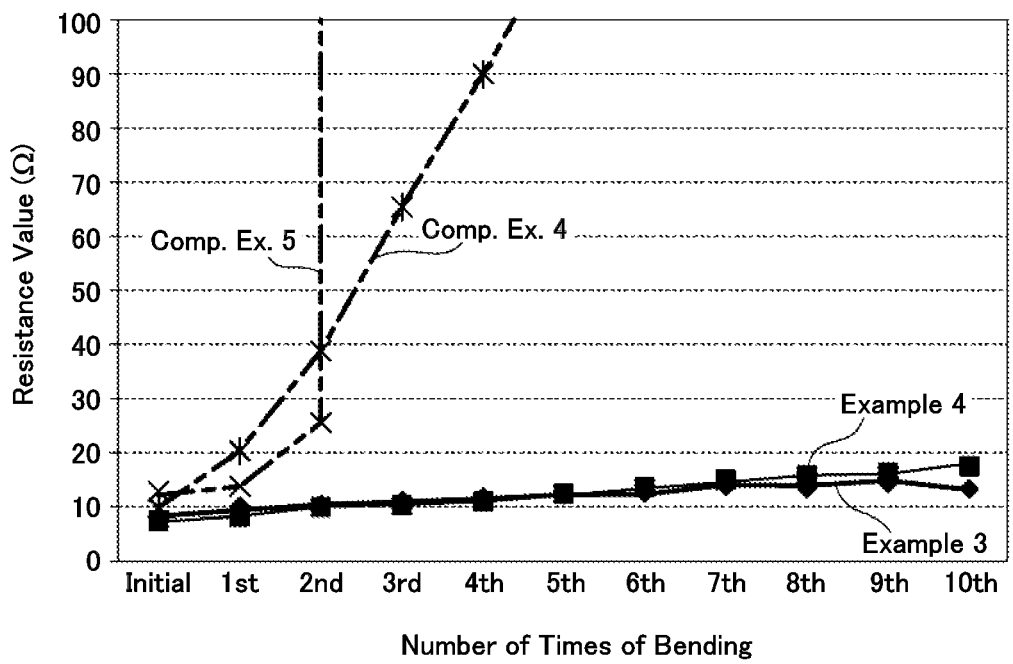
FIG. 10 is a graph illustrating a result of a resistance value of the second conductive layer 40 in Examples 3 and 4 and Comparative Examples 4 and 5 during a bending test.

Particularly, the resistance of the second conductive layer 40 increased. Further, in Comparative Example 1, a crack was generated after the bending test. Here, FIG. 9 illustrates the result of the resistance value of the second conductive layer 40 in Examples 1 and 2 and Comparative Examples 1 to 3 during the bending test as a graph, and FIG. 10 illustrates the result of the resistance value of the second conductive layer 40 in Examples 3 and 4 and Comparative Examples 4 and 5 during the bending test as a graph. As understood from FIGS. 9 and 10, in Examples 1 to 4, an increase in resistance value in accordance with an increase in the number of times of bending was effectively suppressed, and in Comparative Examples 1 to 5, the resistance value abruptly increased after several times of bending.

EXPLANATIONS OF LETTERS OR NUMERALS 1, 1a Printed circuit board
10 Substrate
20 First conductive layer
30 First insulation layer
40 Second conductive layer
50 Second insulation layer
60 Third insulation layer
70 Additional layer

The invention claimed is:

1. A printed circuit board which is used in a bent state, comprising:
a substrate;
a first conductive layer which is formed on the substrate;
a first insulation layer which is formed on the substrate so as to cover the first conductive layer; and
a second conductive layer which is formed on the first insulation layer,
wherein Young's modulus of the first insulation layer is $Ei1$, a fracture elongation of the second conductive layer is $Bc2$, and the following equations (I) and (II) are satisfied:

$$10 \text{ MPa} < Ei1 < 500 \text{ MPa} \quad \text{(I)}$$

$$Bc2 \geq 10\% \quad \text{(II)}.$$

2. The printed circuit board according to claim 1, wherein a glass-transition temperature of the first insulation layer is 30° C. or less.

3. The printed circuit board according to claim 1, further comprising:
a second insulation layer which is formed on the first insulation layer so as to cover the second conductive layer,
wherein a surface roughness Ra of the second insulation layer falls into a range of 0.1 μm<Ra<10 μm.

4. The printed circuit board according to claim 1, further comprising:
a third insulation layer which is different from the first insulation layer and is formed between the first conductive layer and the first insulation layer,
wherein a Young's modulus of the third insulation layer is indicated by $Ei3$, and the following equation (III) is satisfied:

$$Ei1 > Ei3 \quad \text{(III)}.$$

5. The printed circuit board according to claim 4, wherein a following equation (IV) is satisfied:

$$1 \text{ MPa} < Ei3 < 100 \text{ MPa} \quad \text{(IV)}.$$

6. The printed circuit board according to claim 4, wherein a glass-transition temperature of the third insulation layer is lower than a glass-transition temperature of the second insulation layer.

7. The printed circuit board according to claim 1, further comprising:
an additional layer which is formed on a surface of the substrate opposite to the first conductive layer.

8. The printed circuit board according to claim 1, wherein the first conductive layer and the second conductive layer are each formed by using a conductor paste including a conductor particle and a binder resin.

9. The printed circuit board according to claim 1, wherein the Young's modulus of the first insulation layer $Ei1$ satisfies a following equation (V):

$$10 \text{ MPa} < Ei1 < 500 \text{ MPa} \quad \text{(V)}.$$

10. The printed circuit board according to claim 1, wherein a fracture elongation of the first insulation layer is $Bi1$, and a following equation (VI) is satisfied:

$$Bi1 > 100\% \quad \text{(VI)}.$$

11. The printed circuit board according to claim 1, wherein a Young's modulus of the second conductive layer is $Ec2$, and a following equation (VII) is satisfied:

$$100 \text{ MPa} < Ec2 < 1000 \text{ MPa} \quad \text{(VII)}.$$

* * * * *